United States Patent
Kang et al.

(10) Patent No.: US 7,485,494 B2
(45) Date of Patent: Feb. 3, 2009

(54) DICING DIE ADHESIVE FILM FOR SEMICONDUCTOR

(75) Inventors: Byoung-Un Kang, Gyeonggi-do (KR); Jai-Hoon Kim, Seoul (KR); Joon-Mo Seo, Gyeonggi-do (KR); Tae-Hyun Sung, Seoul (KR); Dong-Cheon Shin, Seoul (KR); Kyung-Tae Wi, Seoul (KR)

(73) Assignee: LS Cable Ltd., Gyeonggi-do (KR)

( * ) Notice: Subject to any disclaimer, the term of this patent is extended or adjusted under 35 U.S.C. 154(b) by 469 days.

(21) Appl. No.: 11/413,938

(22) Filed: Apr. 27, 2006

(65) Prior Publication Data

US 2006/0244132 A1    Nov. 2, 2006

(30) Foreign Application Priority Data

Apr. 28, 2005 (KR) .............. 10-2005-0035742
Jan. 24, 2006 (KR) .............. 10-2006-0007280

(51) Int. Cl.
 *H01L 21/00* (2006.01)

(52) U.S. Cl. .................. 438/113; 438/118; 257/783

(58) Field of Classification Search ............... 438/113, 438/118, 460, FOR. 385; 257/782, 783
See application file for complete search history.

(56) References Cited

U.S. PATENT DOCUMENTS

| | | | |
|---|---|---|---|
| 2005/0215032 A1* | 9/2005 | Seo et al. | 438/460 |
| 2006/0226520 A1* | 10/2006 | Yoshimura et al. | 257/666 |
| 2007/0015342 A1* | 1/2007 | Abe | 438/458 |
| 2007/0117259 A1* | 5/2007 | Anderson et al. | 438/106 |
| 2007/0120271 A1* | 5/2007 | Kozakai et al. | 257/779 |
| 2007/0134846 A1* | 6/2007 | Takahashi et al. | 438/113 |

* cited by examiner

*Primary Examiner*—S. V Clark
(74) *Attorney, Agent, or Firm*—Husch Blackwell Sanders Welsh & Katz

(57) ABSTRACT

A dicing die adhesive film for semiconductor of the present invention has a 3-layered structure including a first adhesive layer attached on the back of a semiconductor wafer; a second adhesive layer attached onto the first adhesive layer; and a dicing film attached onto the second adhesive layer, and therefore has an advantage that it can ensure reliability of the semiconductor packaging process since it may prevent the die-flying phenomenon and the poor pickup of the die in the dicing process and maintain a sufficient adhesive force between the die and the substrate upon die boding.

12 Claims, 6 Drawing Sheets

DICING DIE ADHESIVE FILM FOR SEMICONDUCTOR

BACKGROUND OF THE INVENTION

1. Field of the Invention

The present invention relates to a dicing die adhesive film for semiconductor, and more specifically a dicing die adhesive film for semiconductor attached to the back of a semiconductor wafer to assist a dicing process and further attach a semiconductor chip and a substrate to each other.

2. Description of the Related Art

Generally, paste-type adhesives were used for attaching a semiconductor chip to a chip-mounted frame in the prior art. However, the paste-type adhesives have problems that it is difficult to control their thickness, a bleeding phenomenon is caused, and the wafer leveling process is also impossible when they were applied. As a result, the film-type die adhesives have been increasingly used in the recent years.

The semiconductor process in which the film-type die adhesive was generally used includes steps of attaching a die adhesive film to a semiconductor wafer and attaching an additional dicing tape thereto again, followed by undergoing the dicing process. There has been recently proposed the DDAF (dicing die adhesive film) having both a dicing function and a die adhesive function so as to simplify the two-step film adhesion process in the semiconductor process.

However, the process of attaching the dicing film to the backside of the wafer should not be conducted at a high temperature because the dicing film is mainly composed of polyolefins. Meanwhile, if the adhesion process is carried out at a relatively low temperature to prevent deformation of a dicing film, the dicing film has poor adhesive forces between a wafer and a die adhesive film and between a die adhesive film and a dicing film. Accordingly, the dicing film has disadvantages that it is difficult to separate the die adhesive film upon picking up the die, and the die flying is caused in the dicing process.

In order to solve the above-mentioned problems, pressure-sensitive and photosensitive materials were used as the adhesive material for a dicing film, and the die and the die adhesive film were easily picked up by means of the subsequent processes such as UV-irradiation and heat treatment after the dicing process. However, such a technique has problems that the adhesive force between the die adhesive film and the substrate may be weakened by the heat treatment and a poor and erroneous operation may be caused by the UV-irradiation on driving the semiconductor chip, as well as its process is complex and the manufacturing cost is increased.

SUMMARY OF THE INVENTION

Therefore, the present invention is designed to solve the problems of the prior art, and it is an object of the present invention to provide a dicing die adhesive film for semiconductor capable of preventing a die-flying phenomenon and poor pickup of the die in the dicing process and maintaining a sufficient adhesive force between the die and the substrate upon die boding by maintaining a high adhesive force between a wafer and a die adhesive film and a low peel strength between a die adhesive film and a dicing film when it is attached to the back of a wafer.

In order to accomplish the above object, the present invention provides a dicing die adhesive film for semiconductor having a 3-layered structure comprising a first adhesive layer attached to the back of a semiconductor wafer; a second adhesive layer attached onto the first adhesive layer; and a dicing film attached onto the second adhesive layer, and used in conducting a semiconductor packaging process including: (a1) a lamination process for attaching the dicing die adhesive film to the back of the semiconductor wafer, (a2) a wafer dicing process for separating a die from die fragments by conducting a cutting operation through the front side of the laminated semiconductor wafer, (a3) a die pick-up process for picking up the die separated by the dicing process so that the first adhesive layer and the second adhesive layer keep attached to the back of the die and the dicing film is separated using a pickup tool, (a4) a die bonding process for attaching the picked-up die to the substrate, and (a5) a curing process for enhancing an adhesive force between the substrate and the die, wherein an interlayer adhesive force (T1) between the semiconductor wafer and the first adhesive layer is maintained at 20 gf/cm or more, and an interlayer adhesive force (T2) between the second adhesive layer and the dicing film is maintained at 3 gf/cm or more after the lamination process (a1); wherein an interlayer adhesive force (Ta1) between the die and the first adhesive layer is maintained at a higher level than an interlayer adhesive force (Ta2) between the second adhesive layer and the dicing film during the die pick-up process (a3); wherein an interlayer adhesive force (Tb1) between the die and the first adhesive layer, and an interlayer adhesive force (Tb2) between the second adhesive layer and the substrate are all maintained at a level greater than 100 gf/cm after the die bonding process (a4); and wherein an interlayer adhesive force (Tc1) between the die and the first adhesive layer, and an interlayer adhesive force (Tc2) between the second adhesive layer and the substrate are all maintained at a level greater than 500 gf/cm after the curing process (a5).

BRIEF DESCRIPTION OF THE DRAWINGS

Preferred embodiments of the present invention will be more fully described referring to the accompanying drawings. However, it should be understood that the description proposed herein is just a preferable example for the purpose of illustrations only, not intended to limit the scope of the invention. In the drawings.

DESCRIPTION OF THE PREFERRED EMBODIMENT

Hereinafter, preferred embodiments of the present invention will be described in detail referring to the accompanying drawings. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
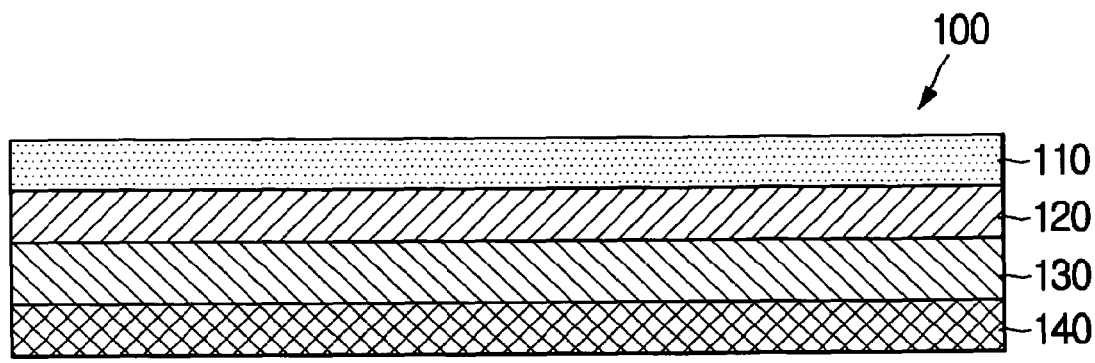
FIG. 1 is a cross-sectional view showing a dicing die adhesive film according to a preferred embodiment of the present invention.

FIG. 1 is a cross-sectional view showing a dicing die adhesive film according to a preferred embodiment of the present invention.

Referring to FIG. 1, the dicing die adhesive film 100 according to this embodiment has a layered structure including a base film 110, a first adhesive layer 120 attached to one surface of the base film 110, a second adhesive layer 130 attached to the first adhesive layer 120, and a dicing film 140 attached to the second adhesive layer 130.

The base film 110 is a member for maintaining a basic form of the adhesive film, and may be preferably made of at least one selected from the group consisting of, but not necessarily limited to, polyethylene terephthalate (PET) and polyethylene-2,6-naphthalenedicarboxylate (PEN).

The first adhesive layer 120 of the dicing die adhesive film is a material layer attached to the back of a wafer during a semiconductor packaging process and requiring a high adhesive force to the die which is a wafer fragment. The first adhesive layer 120 of the dicing die adhesive film is made of a composition including 0.5 to 15 parts by weight of a UV-initiator and 0.1 to 30 parts by weight of an inorganic filler, based on 100 parts by weight of the composition including 20 to 70% by weight of liquid epoxy resin and 30 to 80% by weight of solid epoxy resin.

The second adhesive layer 130 of the dicing die adhesive film is a material layer requiring a lower adhesive force than that required between the first adhesive layer 120 and the die, and is attached to the dicing film 140. The second adhesive layer 130 of the dicing die adhesive film is made of a composition including 0.5 to 15 parts by weight of a UV-initiator and 0.1 to 30 parts by weight of an inorganic filler, based on 100 parts by weight of the composition including 20 to 70% by weight of liquid epoxy resin and 30 to 80% by weight of solid epoxy resin.

In the above description, there are three methods for weakening the adhesive force between the second adhesive layer 130 and the dicing film 140, as described below. In the first method, the content of the inorganic filler is made up so that the inorganic filler included in the composition for manufacturing the second adhesive layer is greater than that of the inorganic filler included in the composition for manufacturing the first adhesive layer as much as 0.1 to 15 parts by weight. In the second method, the content ratio of the solid epoxy resin to the liquid epoxy resin is made up so that the content ratio of the solid epoxy resin to the liquid epoxy resin included in the composition for manufacturing the second adhesive layer is greater than that of the solid epoxy resin to the liquid epoxy resin included in the composition for manufacturing the first adhesive layer as much as 2 to 50% by weight. In the third method, the content of the UV-initiator is made up so that the content of the UV-initiator included in the composition for manufacturing the second adhesive layer is greater than that of the UV-initiator included in the composition for manufacturing the first adhesive layer as much as 0.1 to 15 parts by weight so as to increase hardness of the adhesive layer and reduce the adhesive force upon UV irradiation. It is apparent that these methods may be used alone, or used in the combination so as to give a synergistic effect.

Preferably, the liquid epoxy resin is at least one material selected from the group consisting of bisphenol-based epoxy, novolak-based epoxy, plastic epoxy, etc.; the solid epoxy resin is at least one material selected from the group consisting of bisphenol-based epoxy, novolak-based epoxy, plastic epoxy, etc.; the inorganic filler is at least one material selected from the group consisting of metals, metal oxides, silicones, etc.; and the UV-initiator is at least one material selected from the group consisting of α-hydroxyketones, phenylglyoxylates, α-aminoketones, benzyldimethylketals, phosphinoxides, metallocenes, etc.

In addition to the aforementioned basic components of the compositions for manufacturing the first adhesive layer 120 and the second adhesive layer 130, additives, which is suitable for these objects of the present invention without affecting the effects of the present invention, may be further included therein, and the additives include, but not limited to, for example an epoxy curing agent, a coupling agent, a UV curing formulation and so on. The epoxy curing agent is preferably at least one material selected from the group consisting of amines, organic acid anhydrides, phenol resin, a minoresin and so on, and the used coupling agent is preferably at least one material selected from the group consisting of silanes, titaniums and so on. Also, the used UV curing formulation is preferably at least one material selected from the group consisting of acryls, epoxys, urethanes, phenols and so on.

In the semiconductor wafer dicing process, the dicing film 140 is a member temporally attached to the semiconductor wafer to hold and support a wafer upon cutting the wafer, and is a polyvinylchloride-based or polyolefin-based film coated with an adhesive material such as acryls, rubbers, polyesters, silicones and so on.

The dicing die adhesive film 100 is employed in a semiconductor chip manufacturing process through the processes as shown in FIGS. 2 to 8, and will be described in detail with reference to FIGS. 2 to 8.

FIGS. 2 to 8 are schematic views illustrating a semiconductor packaging process using a dicing die adhesive film according to one preferred embodiment of the present invention.

Figure 2:
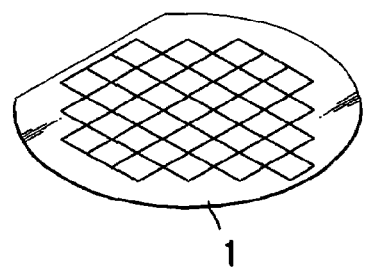
FIGS. 2 to 8 are schematic views showing a semiconductor packing process using the dicing die adhesive film according to a preferred embodiment of the present invention.
Figure 3:
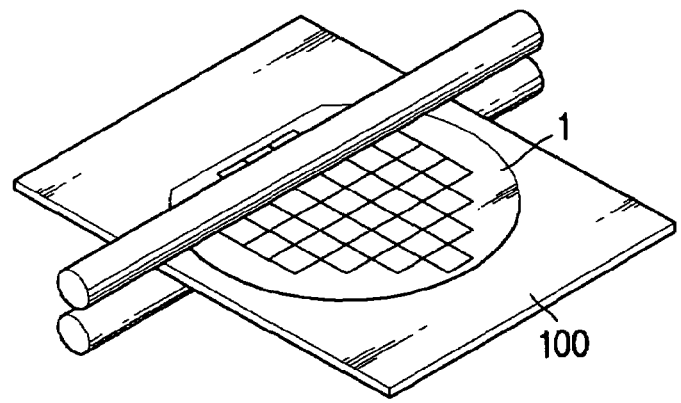

Firstly, the semiconductor wafer 1 is prepared as shown in FIG. 2. A lamination process in which the dicing die adhesive film 100 is attached to the back of the resultant semiconductor wafer 1 is conducted, as shown in FIG. 3. At this time, the base film 110 attached to the top surface of the dicing die adhesive film 100 should be removed prior to the lamination process. Accordingly, the first adhesive layer 120 is attached onto the back of the wafer 1. Meanwhile, the lamination process is preferably carried out at the room temperature to 100° C. under a pressure of 0.5 to 10 kgf to give good flowability of small-molecule materials in the dicing die adhesive film 100. At this time, the interlayer adhesive force (T1) between the semiconductor wafer 1 and the first adhesive layer 120 after the lamination process is preferably maintained at 20 gf/cm or more to prevent a die flying phenomenon from being generated during the semiconductor wafer dicing process, and the interlayer adhesive force (T2) between the second adhesive layer 130 and the dicing film 140 is preferably maintained at 3 gf/cm or more to prevent a die flying phenomenon from being generated and hinder foreign substances from be introduced between the second adhesive layer 130 and the dicing film 140 during the dicing process.

Figure 4:
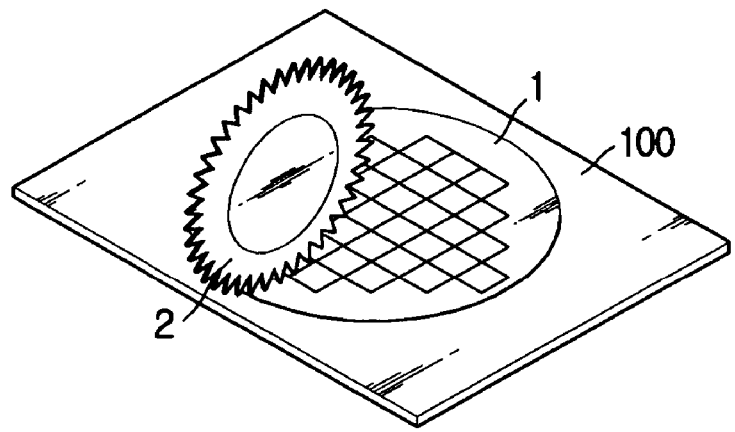

After the lamination process is completed, the dicing process is carried out by cutting the semiconductor wafer 1 to a predetermined chip size using a blade 2, as shown in FIG. 4, followed by undergoing the washing/drying process. In the dicing process, the wafer 1, and the first adhesive layer 120 and the second adhesive layer 130 sequentially attached to the bottom thereof are thoroughly cut along a cutting line, and the dicing film 140 attached to form the lowest layer in the bottom of the wafer 1 is also partially cut to a specific depth.

Figure 5:
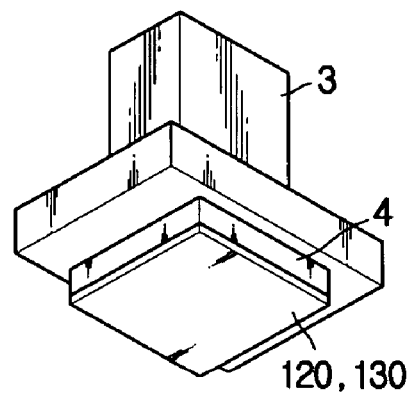

The die 4 cut in the dicing process as described above is picked up using a pickup tool 3, as shown in FIG. 5. At this time, the die 4 attached to the first adhesive layer 120 may be picked up from the dicing film 140 by the pickup tool 3 only if the interlayer adhesive force (Ta1) between the die 4 and the first adhesive layer 120 be maintained at a higher level than the interlayer adhesive force (Ta2) between the second adhesive layer 130 and the dicing film 140.

Figure 6:
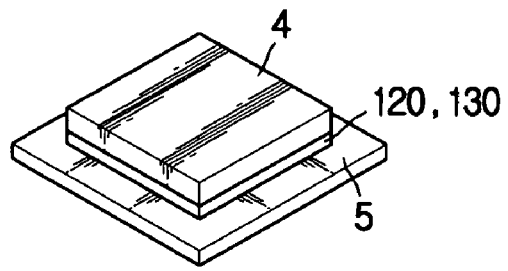

After that, a die bonding process is carried out by attaching the die 4 onto a lead frame or a substrate 5 such as a printed circuit board (PCB) or a tape wiring board, as shown in FIG. 6. At this time, a reliable adhesive force is sufficiently ensured in the die bonding process only if an interlayer adhesive force (Tb1) between the die 4 and the first adhesive layer 120, and an interlayer adhesive force (Tb2) between the second adhesive layer 130 and the substrate 5 are all maintained at a level greater than 100 gf/cm right after the die bonding process.

Subsequently, a curing process may be carried out to strengthen the adhesive force between the die 4 and the substrate 5. At this time, an interlayer adhesive force (Tc1) between the die 4 and the first adhesive layer 120, and an interlayer adhesive force (Tc2) between the second adhesive layer 130 and the substrate 5 should be all maintained at a level greater than 500 gf/cm after the curing process. If the adhesive force is not maintained in the above range, separation between the die 4 and the first adhesive layer 120 and between the second adhesive layer 120 and the substrate 5 may be generated during the subsequent processes, which adversely affects reliability of the adhesive force, resulting in inferior products.

Figure 7:
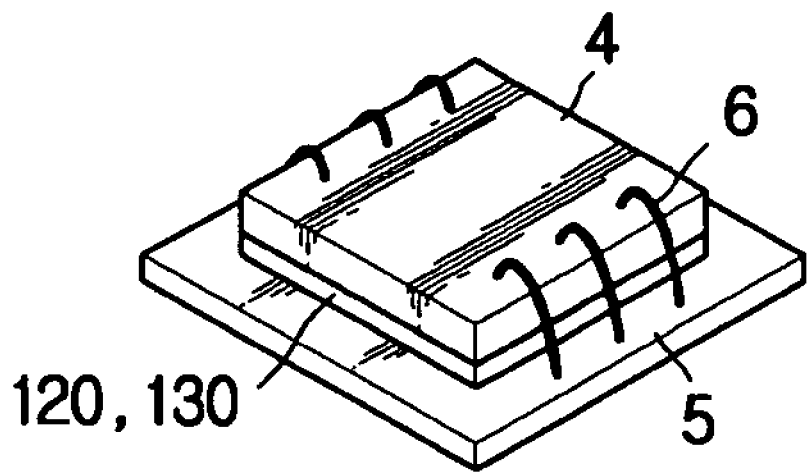
Figure 8:
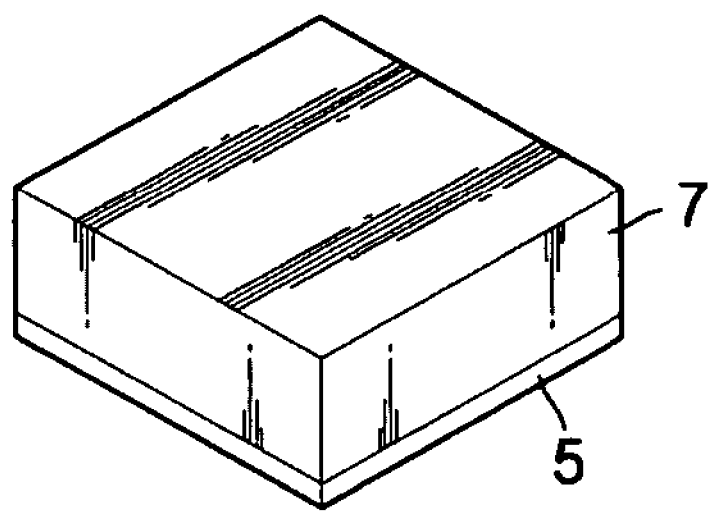

Subsequently, the die 4, used as the semiconductor chip, and the substrate 5 are connected to each other by a wire bonding process 6 as shown in FIG. 7, and then a semiconductor chip is finally packaged by an epoxy molding process 7 as shown in FIG. 8.

Hereinafter, a manufacturing process of the dicing die adhesive film 100 used for the aforementioned packaging process of the semiconductor chip will be described in detail with reference to FIGS. 9 to 13.

Figure 9:
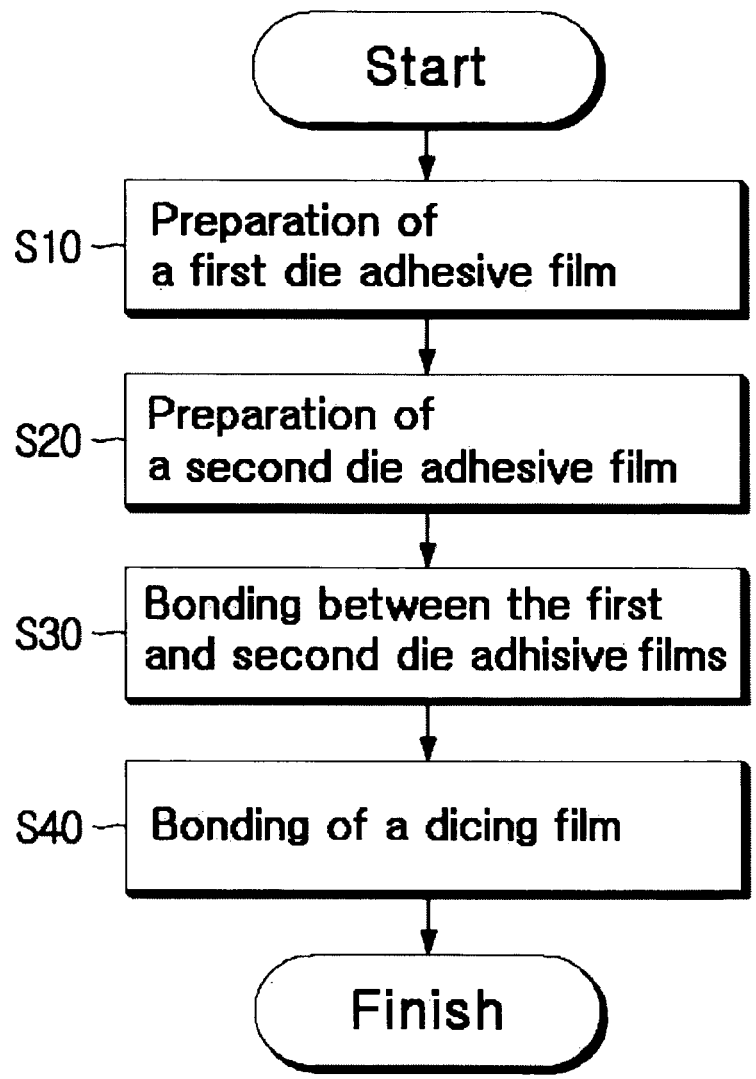
FIG. 9 is a flow chart showing a process of manufacturing the dicing die adhesive film according to the present invention.
Figure 10:
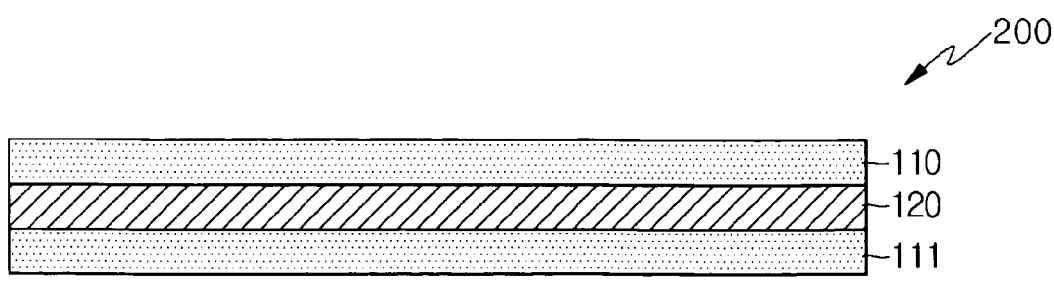
FIGS. 10 and 11 are cross-sectional views showing a process of manufacturing the dicing die adhesive film according to the present invention.
Figure 11:
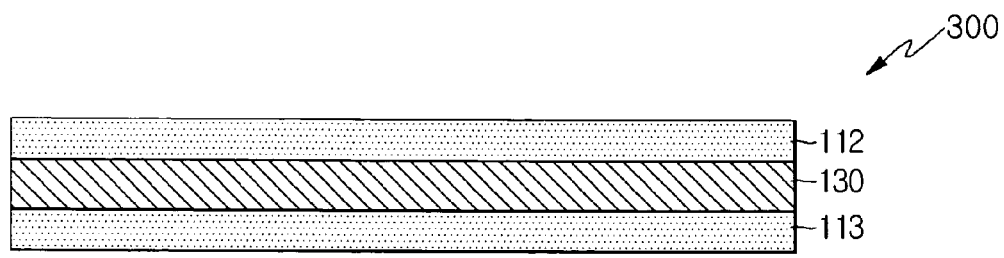
Figure 12:
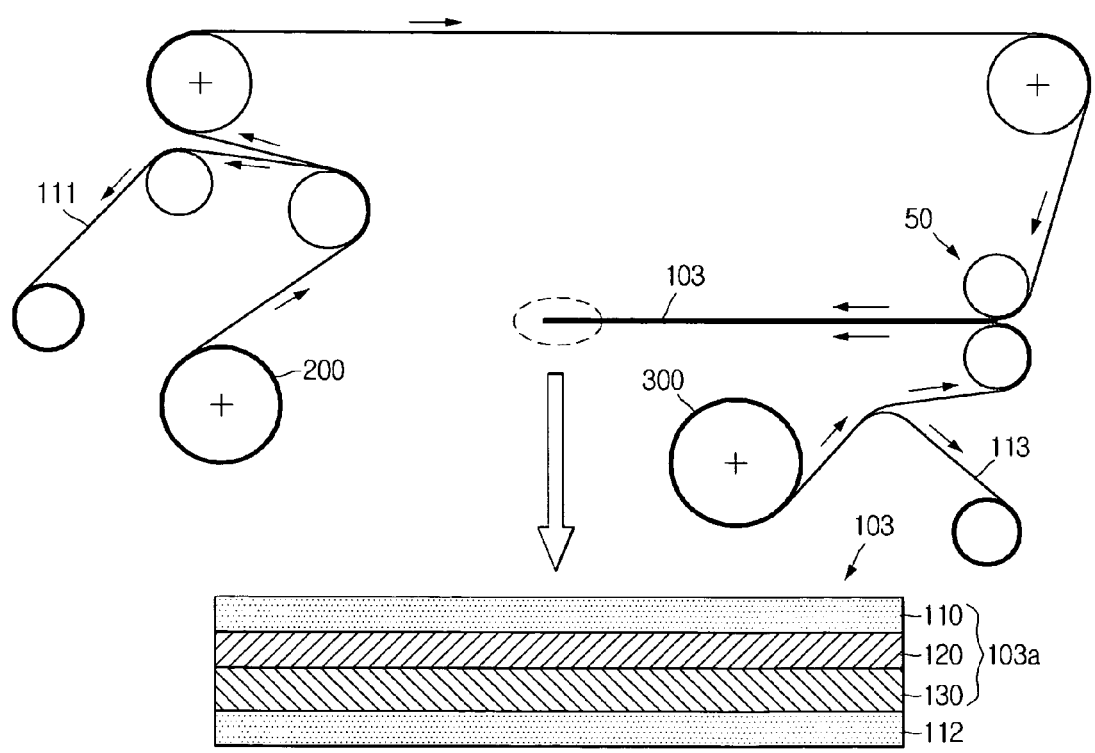
FIGS. 12 and 13 are schematic views illustrating a method of manufacturing the dicing die adhesive film according to the present invention.
Figure 13:
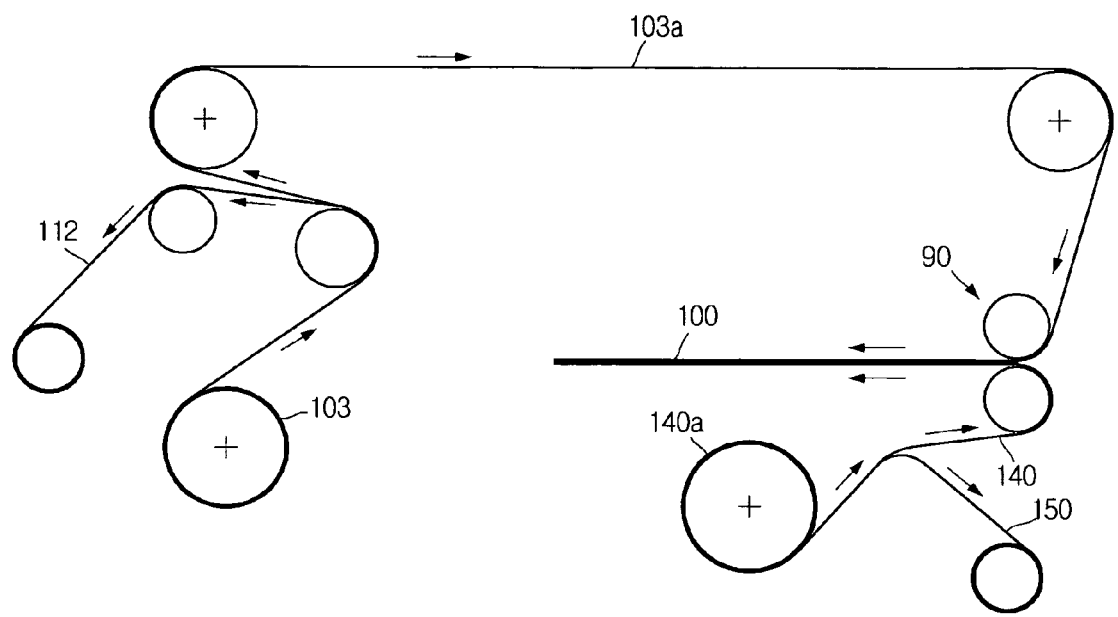

FIG. 9 is a flow chart showing a process of manufacturing a dicing die adhesive film according to the present invention; FIGS. 10 and 11 are cross-sectional views showing a process of manufacturing a first die adhesive film (200 in FIG. 10) and a second die adhesive film (300 in FIG. 11) according to the present invention; and FIGS. 12 and 13 are schematic views illustrating a method of manufacturing the dicing die adhesive film (100 in FIG. 1) according to the present invention.

Referring to FIG. 9, it may be seen that the process for manufacturing the dicing die adhesive film of the present invention is conducted according to the steps of preparing a first die adhesive film (S10); preparing a second die adhesive film by means of a process separately from the step of preparing the first die adhesive film (S20); attaching the prepared first and second die adhesive films to each other (S30); and finally attaching a dicing film thereto (S40).

The dicing die adhesive films according to the present invention are manufactured by casting the coating layers which are formed by coating a base film with coating solutions for manufacturing the first adhesive film and the second adhesive film using a roll coater such as an air knife coater, a comma coater, a lip coater, a gravure coater and so on (S10 and S20), followed by attaching the two layers, independently prepared in the lamination process, at the temperature condition from a room temperature to 150° C. to each other and laminating the dicing film onto the second adhesive layer. Hereinafter, the process for manufacturing the dicing die adhesive film will be described step by step, as follows.

In order to prepare a first die adhesive film 200 according to the step S10, a coating layer for preparing the first adhesive layer is firstly formed by coating the first base film 110 with a coating solution for preparing the first adhesive layer having a high adhesive force to the die. Preferably, the coating layer for preparing the first adhesive layer is formed so that it can have a thickness of 150 μm or less, more preferably a thickness of 1 to 100 μm. The thickness may be adjusted by controlling a line speed of a coater (not shown), ejecting capacity and gap between lip pads. The coating solution for preparing the first adhesive layer is prepared using the composition as described above, that is, a composition including liquid epoxy resin, solid epoxy resin, an inorganic filler and a UV-initiator. Subsequently, the first adhesive layer 120 is formed by means of the heat-treatment and UV-irradiation of the coating layer for preparing the first adhesive layer coated on the base film 110 for the purpose of maintaining a shape of the film. Finally, an exposed surface of the first adhesive layer 120 is covered with a first protective film 111 to protect the first adhesive layer 120 from the outer environment after the UV-irradiation, and taken up by a roller to obtain a first die adhesive film 200 having a 3-layer laminated structure.

A process for preparing a second die adhesive layer 300 according to the step S20 is carried out in the similar manner to the step 10 of preparing the first die adhesive film 200. A second base film 112 is firstly coated with a coating solution for preparing the second adhesive layer. In this case, the coating solution for preparing the second adhesive layer is preferably composed to weaken the adhesive force to a dicing film to be attached in the subsequent processes. For this purpose, the coating solution for preparing the second adhesive layer is prepared using the composition as described above in the coating solution for preparing the first adhesive layer, that is, a composition including solid epoxy resin, liquid epoxy resin, an inorganic filler and a UV-initiator. At this time, one of the three methods described above is preferably adapted and conducted for the purpose of weakening the adhesive force of the second adhesive layer to the dicing film to be attached in the subsequent processes.

After that, the second base film 112 is coated with the coating solution for preparing the second adhesive layer prepared above to form a coating layer for preparing a second adhesive layer, and then subject to heat treatment and UV-irradiation processes in the same manner as the step 10 of preparing the first die adhesive film. At this time, the heat treatment and UV-irradiation processes are conducted while reducing a line speed so that an adhesive force between the second adhesive layer 130, prepared from the coating layer for preparing the second adhesive layer, and the substrate can be lower than an adhesive force between the first adhesive layer 120 and the die. As a result, the second adhesive layer 130 is formed on the second base film 112, but the second die adhesive layer 300 having a 3-layer laminated structure is finally prepared by further attaching a second protective film 113 to an exposed surface of the second adhesive layer 130 for the purpose of protecting the second adhesive layer 130 exposed outward.

As described above, if the first die adhesive film 200 and the second die adhesive layer 300 are independently prepared, a step of attaching the die adhesive films 200, 300 to each other (S30) is conducted in the same manner as shown in FIGS. 12 and 13. Each surface of the first adhesive layer 120 and the second adhesive layer 130 is exposed outward by removing the first protective film 111 from the die adhesive film 200 which remains wound around each roller in the interlayer attachment step S30, followed by removing the second protective film 113 from the second die adhesive layer 300. Then, each of the exposed surfaces of the first adhesive layer 120 and the second adhesive layer 130 is laminated so that the exposed surfaces closely face each other and are attached between the layers using a lamination roll 50. At this time, the temperature of the lamination roll 50 is preferably maintained at the room temperature to 150° C. to ensure good flowability of low molecular substances constituting each of the adhesive layers 120, 130 and prevent bubbles from being generated in the bonding interface between the first adhesive layer 120 and the second adhesive layer 130. As a result, a 4-layer laminated die adhesive film 103 having the first base film 110, the first adhesive layer 120, the second adhesive layer 130 and the second base film 112 is formed. Meanwhile, since the lamination process is conducted after the second base film 112 is removed from the die adhesive film 103 in the subsequent processes, this is referred to as a 3-layered die adhesive film 103a to be distinguished from the die adhesive film 103.

The second base film 112 attached onto the second adhesive layer 130 is removed from the die adhesive film 103 prepared as described above, and then the dicing film 140 prepared independently is finally attached thereto to obtain a dicing die adhesive film 100 having a 4-layered structure as shown in FIG. 1 (S40). This process will be described in detail, as follows. An adhesive surface of the dicing film 140 is preferably prepared with a dicing lamination film 140a to which a protective film 150 is attached to protect the dicing film 140 from the outer environment. Accordingly, the dicing lamination film 140a is taken up around a roller, and then the dicing film 140 in which the protective film 150 is removed is supplied to a lamination roll 90. At the same time, the die adhesive film 103 prepared by the procedure described with reference to FIG. 12 is taken up around a roller, and then the 3-layered die adhesive film 103a in which the second base film 112 attached onto the second adhesive layer 130 is removed is supplied to the lamination roll 90. At this time, the temperature of the lamination roll 90 is preferably maintained at 25 to 80° C., considering the adhesive force between the second adhesive layer 130 and dicing film 140 in the die adhesive film 103a. The dicing film 140 and the die adhesive film 103a, both supplied to the lamination roll 90 as described above, are attached to each other to form a 4-layer laminated dicing die adhesive film (100 in FIG. 1) which is sequentially composed of the first base film 110, the first adhesive layer 120, the second adhesive layer 130 and the dicing film 140.

Meanwhile, the die adhesive film 103a is manufactured by the dicing process and the die pickup process, followed by the die bonding process and the curing process, and therefore the die adhesive film 103a preferably has a storage modulus of 100 to 10,000 MPa at 25° C. It is a necessary condition on physical properties for improving the reliability of a finished semiconductor chip to secure a level of storage modulus capable of buffering thermal stress caused by the curing process because different materials forming a laminated structure show different thermal expansion coefficients after the curing process. In addition, the storage modulus of the die adhesive film 103a at 280° C. ranges from 0.1 to 1,000 MPa, and is preferably smaller than the storage modulus at 25° C. It is because the reliability of the product may not be ensured due to an extremely low internal stress if the storage modulus at a high temperature is less than 0.1 MPa, and the heat shock may be ineffectively absorbed if the storage modulus at a high temperature exceeds 1,000 MPa.

Also, the dicing die adhesive film 100 according to the present invention may be manufactured with a structure having an organic insulator layer (not shown) interposed between the first adhesive layer 120 and the second adhesive layer 130. The organic insulator layer may preferably increase the low storage modulus or reduce the thermal expansion coefficient, and be inserted between die adhesive films to easily control a thickness of a thick film in the manufacturing process of the film, and also minimize the external impulses such as vibration and so on upon wire bonding since it gives an effect on increase of the internal bonding strength. A kind of films such as polyimides, polyolefins, polyacetalates, polyvinyls, etc. may be used for the organic insulator layer.

Hereinafter, the present invention will be described in detail with reference to specific examples for better understandings. However, it should be understood that the detailed description and specific examples according to preferred embodiments of the invention are given by way of illustration only, since various changes and modifications within the spirit and scope of the invention will become apparent to those skilled in the art from this detailed description.

First and second adhesive layers of dicing die adhesive films were manufactured using compositions having contents as in the Examples 1 and 2 and the comparative examples 1 to 4, as listed in the following Table 1.

TABLE 1

|  | Example 1 Adhesive layer | | Example 2 Adhesive layer | | Comparative example 1 Adhesive layer | | Comparative example 2 Adhesive layer | | Comparative example 3 Adhesive layer | | Comparative example 4 Adhesive layer | |
| --- | --- | --- | --- | --- | --- | --- | --- | --- | --- | --- | --- | --- |
|  | 1st | 2nd | 1st | 2nd | 1st | 2nd | 1st | 2nd | 1st | 2nd | 1st | 2nd |
| Solid epoxy resin (wt %) | 50 | 55 | 53 | 58 | 60 | 60 | 60 | 50 | 55 | 90 | 55 | 90 |
| Liquid epoxy resin (wt %) | 50 | 45 | 47 | 42 | 40 | 40 | 40 | 50 | 45 | 10 | 45 | 10 |
| Content ratio of Solid epoxy resin to Liquid epoxy resin | 100 | 120 | 112 | 138 | 150 | 150 | 150 | 100 | 120 | 900 | 120 | 900 |
| Inorganic filler (parts by weight) | 5 | 10 | 8 | 8 | 8 | 8 | 10 | 6 | 5 | 5 | 6 | 10 |
| UV-initiator (parts by weight) | 3 | 5 | 5 | 5 | 2 | 5 | 5 | 5 | 5 | 5 | 5 | 5 |

TABLE 1-continued

|  | Example 1 Adhesive layer | | Example 2 Adhesive layer | | Comparative example 1 Adhesive layer | | Comparative example 2 Adhesive layer | | Comparative example 3 Adhesive layer | | Comparative example 4 Adhesive layer | |
| --- | --- | --- | --- | --- | --- | --- | --- | --- | --- | --- | --- | --- |
|  | 1st | 2nd | 1st | 2nd | 1st | 2nd | 1st | 2nd | 1st | 2nd | 1st | 2nd |
| Curing agent (when added) | 5 | 5 | 5 | 5 | 5 | 5 | 5 | 5 | 5 | 5 | 5 | 5 |
| Curing formulation (when added) | 4 | 4 | 4 | 4 | 4 | 4 | 4 | 4 | 4 | 5 | 4 | 4 |
| Coupling agent (when added) | 4 | 3 | 3 | 3 | 3 | 3 | 3 | 3 | 3 | 2 | 3 | 3 |

The first and second adhesive layers were manufactured using compositions having contents as in the examples 1 and 2 and the comparative examples 1 to 4 according to Table 1, and then dicing die adhesive films were completed using the first and second adhesive layers. The dicing die adhesive films were separately measured for the interlayer adhesive force according to the following Table 2, in combination with the semiconductor packaging process described with reference to FIGS. 2 to 8. Meanwhile, a peel strength was measured for the interlayer adhesive force at a room temperature to 180° C. using a push pull gauge.

TABLE 2

|  | Conditions | Requirements of the present invention |
| --- | --- | --- |
| T1 | After a lamination process, Interlayer adhesive force between a semiconductor wafer and a first adhesive layer | T1 ≧ 20 gf/cm |
| T2 | After a lamination process, Interlayer adhesive force between a second adhesive layer and a dicing film | T2 ≧ 3 gf/cm |
| Ta1 | During a die pickup process, Interlayer adhesive force between a die and a first adhesive layer | Ta1 > Ta2 |
| Ta2 | During a die pickup process, Interlayer adhesive force between a second adhesive layer and a dicing film |  |
| Tb1 | After a die pickup process, Interlayer adhesive force between a die and a first adhesive layer | Tb1 > 100 gf/cm |
| Tb2 | After a die pickup process, Interlayer adhesive force between a second adhesive layer and a substrate | Tb2 > 100 gf/cm |
| Tc1 | After a curing process, Interlayer adhesive force between a die and a first adhesive layer | Tc1 > 500 gf/cm |
| Tc2 | After a curing process, Interlayer adhesive force between a second adhesive layer and a substrate | Tc2 > 500 gf/cm |

The measured values of the various interlayer adhesive forces according to Table 2 are listed in the following Table 3, and the value unit is specifically represented by gf/cm.

TABLE 3

|  | Examples | | Comparative examples | | | |
| --- | --- | --- | --- | --- | --- | --- |
|  | 1 | 2 | 1 | 2 | 3 | 4 |
| T1 | 120 | 80 | 24 | 15 | 60 | 60 |
| T2 | 20 | 15 | 2 | 60 | 13 | 2 |
| Ta1 | 110 | 50 | 20 | 13 | 60 | 60 |
| Ta2 | 30 | 18 | 25 | 65 | 15 | 10 |
| Tb1 | 400 | 250 | 100 | 80 | 120 | 120 |
| Tb2 | 300 | 200 | 80 | 90 | 110 | 90 |
| Tc1 | 1200 | 900 | 400 | 200 | 400 | 550 |
| Tc2 | 1100 | 800 | 300 | 250 | 450 | 300 |

The dicing die adhesive films manufactured in the Examples 1 and 2 and the comparative examples according to the contents of Table 1 were measured for various processabilty and reliability tests, for example (1) Presence of die flying in the dicing process, (2) Die pickup easiness, (3) Goodness of die bonding, and (4) MRT (Moisture Resistance Test), and the results are listed in the following Table 4. In the tests, the die pickup easiness was tested by determining whether or not a dicing film is easily peeled from a second adhesive layer; and the goodness of die bonding was also tested by determining whether or not the die flying phenomenon occurs during the void diffusion and the transfer into a chip-mounting frame. In addition, a moisture resistance test (MRT) was carried out under the MRT condition specified in JEDEC/IPC; its stability was measured by determining whether or not a pop corn phenomenon appeared, and whether or not the remaining bubbles were diffused in the samples after the mounted samples were kept alone for a week under a condition of 85° C. and 60% relative humidity and flowed at least three times under a reflow condition having a maximum temperature of 260° C.

TABLE 4

|  | Examples | | Comparative examples | | | |
| --- | --- | --- | --- | --- | --- | --- |
|  | 1 | 2 | 1 | 2 | 3 | 4 |
| Presence of die flying in a dicing process | None | None | Present | Present | None | Present |
| Pickup easiness | Good | Good | Poor | Poor | Good | Good |
| Goodness of die bonding | Good | Good | Poor | Poor | Good | Poor |
| MRT | Passed | Passed | Not passed | Not passed | Not passed | Not passed |

As seen in the Table 4, it was revealed that the dicing die adhesive films prepared by the Examples 1 and 2 according to the present invention exhibited excellent results in the presence of die flying during the dicing process, the pickup easiness, the goodness of die bonding and the MRT. On the contrary, it was seen that evaluations of the dicing die adhesive films were not excellent in the Comparative examples 1 to 4.

As described above, the present invention has been described with reference to the examples and the accompanying drawings. However, it should be understood that the detailed description and specific examples according to preferred embodiments of the invention are given by way of illustration only, since various changes and modifications within the spirit and scope of the invention will become apparent to those skilled in the art from this detailed description.

APPLICABILITY TO THE INDUSTRY

As described above, the dicing die adhesive film for semiconductor according to the present invention may be useful to prevent die flying and tape burr phenomena, prevent poor pickup of the die, and maintain a sufficient adhesive force between the die and the substrate upon die bonding. Accordingly, the dicing die adhesive film for semiconductor according to the present invention may ensure reliability of the semiconductor packaging process.

What is claimed is:

1. A dicing die adhesive film for semiconductor having a 3-layered structure comprising a first adhesive layer attached to the back of a semiconductor wafer; a second adhesive layer attached onto the first adhesive layer; and a dicing film attached onto the second adhesive layer, and used in conducting a semiconductor packaging process comprising: (a1) a lamination process for attaching the dicing die adhesive film to the back of the semiconductor wafer, (a2) a wafer dicing process for separating a die from die fragments by conducting a cutting operation through the front side of the laminated semiconductor wafer, (a3) a die pick-up process for picking up the die separated by the dicing process so that the first adhesive layer and the second adhesive layer keep attached to the back of the die and the dicing film is separated using a pickup tool, (a4) a die bonding process for attaching the picked-up die to the substrate, and (a5) a curing process for enhancing an adhesive force between the substrate and the die, wherein an interlayer adhesive force (T1) between the semiconductor wafer and the first adhesive layer is maintained at 20 gf/cm or more, and an interlayer adhesive force (T2) between the second adhesive layer and the dicing film is maintained at 3 gf/cm or more after the lamination process (a1);

wherein an interlayer adhesive force (Ta1) between the die and the first adhesive layer is maintained at a higher level than an interlayer adhesive force (Ta2) between the second adhesive layer and the dicing film during the die pick-up process (a3);

wherein an interlayer adhesive force (Tb1) between the die and the first adhesive layer, and an interlayer adhesive force (Tb2) between the second adhesive layer and the substrate are all maintained at a level greater than 100 gf/cm after the die bonding process (a4); and wherein an interlayer adhesive force (Tc1) between the die and the first adhesive layer, and an interlayer adhesive force (Tc2) between the second adhesive layer and the substrate are all maintained at a level greater than 500 gf/cm after the curing process (a5).

2. The dicing die adhesive film for semiconductor according to claim 1, wherein, after the curing process (a5), the dicing die adhesive film has a storage modulus of 100 to 10,000 MPa at 25° C., and 0.1 to 1000 MPa at 280° C., and the storage modulus at 280° C. is maintained at a lower level than the storage modulus at 25° C.

3. The dicing die adhesive film for semiconductor according to claim 1, further comprising an organic insulator layer between the first adhesive layer and the second adhesive layer constituting the dicing die adhesive film, the organic insulator layer being made of at least one material selected from the group consisting of polyimides, polyolefins, polyacetalates and polyvinyls.

4. The dicing die adhesive film for semiconductor according to claim 2, further comprising an organic insulator layer between the first adhesive layer and the second adhesive layer constituting the dicing die adhesive film, the organic insulator layer being made of at least one material selected from the group consisting of polyimides, polyolefins, polyacetalates and polyvinyls.

5. The dicing die adhesive film for semiconductor according to claim 1, wherein the first adhesive layer of the dicing die adhesive film is made of a composition including 0.5 to 15 parts by weight of a UV-initiator and 0.1 to 30 parts by weight of an inorganic filler, based on 100 parts by weight of the composition including 20 to 70% by weight of liquid epoxy resin and 30 to 80% by weight of solid epoxy resin;

wherein the second adhesive layer of the dicing die adhesive film is made of a composition including 0.5 to 15 parts by weight of a UV-initiator and 0.1 to 30 parts by weight of an inorganic filler, based on 100 parts by weight of the composition including 20 to 70% by weight of liquid epoxy resin and 30 to 80% by weight of solid epoxy resin; and wherein the content of the inorganic filler is made up so that the inorganic filler included in the composition for manufacturing the second adhesive layer is greater than that of the inorganic filler included in the composition for manufacturing the first adhesive layer as much as 0.1 to 15 parts by weight;

wherein the content ratio of the solid epoxy resin to the liquid epoxy resin is made up so that the content ratio of the solid epoxy resin to the liquid epoxy resin included in the composition for manufacturing the second adhesive layer is greater than that of the solid epoxy resin to the liquid epoxy resin included in the composition for manufacturing the first adhesive layer as much as 2 to 50% by weight; and wherein the content of the UV-initiator is made up so that the content of the UV-initiator included in the composition for manufacturing the second adhesive layer is greater than that of the UV-initiator included in the composition for manufacturing the first adhesive layer as much as 0.1 to 15 parts by weight.

6. The dicing die adhesive film for semiconductor according to claim 5, wherein the liquid epoxy resin is at least one material selected from the group consisting of bisphenol-based epoxy, novolak-based epoxy and plastic epoxy;

wherein the solid epoxy resin is at least one material selected from the group consisting of bisphenol-based epoxy, novolak-based epoxy and plastic epoxy;

wherein the inorganic filler is at least one material selected from the group consisting of metals, metal oxides and silicones; and wherein the UV-initiator is at least one material selected from the group consisting of α-hydroxyketones, phenylglyoxylates, α-aminoketones, benzyldimethylketals, phosphinoxides and metallocenes.

7. The dicing die adhesive film for semiconductor according to claim 5, further comprising an organic insulator layer between the first adhesive layer and the second adhesive layer, the organic insulator layer being made of at least one material selected from the group consisting of polyimides, polyolefins, polyacetalates and polyvinyls.

8. The dicing die adhesive film for semiconductor according to claim 6, further comprising an organic insulator layer between the first adhesive layer and the second adhesive layer, the organic insulator layer being made of at least one material selected from the group consisting of polyimides, polyolefins, polyacetalates and polyvinyls.

9. The dicing die adhesive film for semiconductor according to claim 5,
wherein a storage modulus at 25° C. ranges from 100 to 10,000 MPa, a storage modulus at 280° C. ranges from 0.1 to 1000 MPa, and the storage modulus at 280° C. is maintained at a lower level than the storage modulus at 25° C., after the curing process of the dicing die adhesive film.

10. The dicing die adhesive film for semiconductor according to the claim 9, further comprising an organic insulator layer between first adhesive layer and the second adhesive layer, the organic insulator layer being made of at least one material selected from the group consisting of polyimides, polyolefins, polyacetalates and polyvinyls.

11. The dicing die adhesive film for semiconductor according to claim 6,
wherein a storage modulus at 25° C. ranges from 100 to 10,000 MPa, a storage modulus at 280° C. ranges from 0.1 to 1000 MPa, and the storage modulus at 280° C. is maintained at a lower level than the storage modulus at 25° C., after the curing process of the dicing die adhesive film.

12. The dicing die adhesive film for semiconductor according to the claim 11, further comprising an organic insulator layer between first adhesive layer and the second adhesive layer, the organic insulator layer being made of at least one material selected from the group consisting of polyimides, polyolefins, polyacetalates and polyvinyls.

* * * * *